United States Patent
Ruhl et al.

(10) Patent No.: US 10,150,674 B2
(45) Date of Patent: Dec. 11, 2018

(54) PROCESS FOR THE FORMATION OF A GRAPHENE MEMBRANE COMPONENT, GRAPHENE MEMBRANE COMPONENT, MICROPHONE AND HALL-EFFECT SENSOR

(71) Applicant: Infineon Technologies AG, Neubiberg (DE)

(72) Inventors: Guenther Ruhl, Regensburg (DE); Matthias Koenig, Freising (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/872,772

(22) Filed: Jan. 16, 2018

(65) Prior Publication Data

US 2018/0201511 A1    Jul. 19, 2018

(30) Foreign Application Priority Data

Jan. 18, 2017   (DE) .......................... 10 2017 100 894

(51) Int. Cl.
*C01B 32/194* (2017.01)
*B81C 1/00* (2006.01)
(Continued)

(52) U.S. Cl.
CPC ........ *C01B 32/194* (2017.08); *B81C 1/00658* (2013.01); *C01B 2204/02* (2013.01);
(Continued)

(58) Field of Classification Search
CPC .............. C01B 32/194; C01B 2204/02; C01B 2204/22; H04R 19/016; B81C 1/00658;
(Continued)

(56) References Cited

U.S. PATENT DOCUMENTS 8,833,171 B2 *  9/2014  Besling ................. G01L 9/0042
                                                    73/702
9,516,428 B2 * 12/2016  Dehe ..................... B81B 3/0018
(Continued)

FOREIGN PATENT DOCUMENTS

DE       102014204712 A1    9/2014

OTHER PUBLICATIONS

Koenig, Steven P. et al., "Ultrastrong adhesion of graphene membranes," Nature Nanotechnology, Letters, Aug. 14, 2011, 4 pages.
(Continued)

*Primary Examiner* — Seahvosh Nikmanesh
(74) *Attorney, Agent, or Firm* — Slater Matsil, LLP

(57) ABSTRACT

A process for the formation of a graphene membrane component includes arranging a graphene membrane in a relaxed condition of the graphene membrane on a surface of a supportive substrate. The graphene membrane extends across a cut-out with an opening at the surface of the supportive substrate. The graphene membrane is moreover arranged so that a first portion of the graphene membrane is arranged on the surface of the supportive substrate and a second portion of the graphene membrane is arranged over the opening of the cut-out. The process further includes tensioning of the second portion of the graphene membrane, in order to convert the second portion of the graphene membrane to a tensioned condition, so that the second portion of the graphene membrane is permanently in the tensioned condition in an operating temperature range of the graphene membrane component.

14 Claims, 6 Drawing Sheets

(51) Int. Cl.
*G01R 33/07* (2006.01)
*H04R 19/01* (2006.01)

(52) U.S. Cl.
CPC .......... *C01B 2204/22* (2013.01); *G01R 33/07* (2013.01); *H04R 19/016* (2013.01)

(58) Field of Classification Search
CPC ... H01L 21/324; H01L 21/568; H01L 21/187; H01L 21/26506
See application file for complete search history.

(56) References Cited

U.S. PATENT DOCUMENTS

| | | | |
|---|---|---|---|
| 9,641,949 B2* | 5/2017 | Massoner | B81C 1/00658 |
| 2013/0062104 A1 | 3/2013 | Craighead et al. | |
| 2014/0053651 A1* | 2/2014 | Besling | G01L 9/0016 |
| | | | 73/702 |
| 2014/0270271 A1* | 9/2014 | Dehe | B81B 3/0018 |
| | | | 381/174 |
| 2017/0278930 A1* | 9/2017 | Ruhl | H01L 21/76251 |

OTHER PUBLICATIONS

Temmen, M. et al., "Hydration layers trapped between graphene and a hydrophilic substrate," New Journal of Physics, The open access journal at the forefront of physics, vol. 16, IOP Institute of Physics, May 21, 2014, 15 pages.

Yoon, Duhee et al., "Negative Thermal Expansion Coefficient of Graphene Measured by Raman Spectroscopy," NANO Letters, pubs.acs.org/Nanolett, American Chemical Society, Jul. 2011, 5 pages.

Zong, Zong et al., "Direct measurement of graphene adhesion on silicon surface by intercalation of nanoparticles," IRis Northeastern University, Center for High-Rate Nanomanufacturing Publications, Jan. 29, 2010, 4 pages.

* cited by examiner

PROCESS FOR THE FORMATION OF A GRAPHENE MEMBRANE COMPONENT, GRAPHENE MEMBRANE COMPONENT, MICROPHONE AND HALL-EFFECT SENSOR

CROSS-REFERENCE TO RELATED APPLICATIONS

This application claims the benefit of German Application No. 102017100894.2, filed on Jan. 18, 2017, which application is hereby incorporated herein by reference in its entirety.

TECHNICAL FIELD

Examples relate to production techniques for graphene membrane components and in particular to a process for the formation of a graphene membrane component, to a graphene membrane component, to a microphone with a graphene membrane component and to a Hall-effect sensor with a graphene membrane component.

BACKGROUND

Graphene membrane components are frequently used in microelectromechanical systems (MEMS). It can be desirable here to have a tensioned graphene membrane in a graphene membrane component. For example, U.S. Patent Application Publication No. 2013/0062104 A1 discloses a resonant structure and a process for the production of the resonant structure. The resonant structure includes a substrate and at least one cavity. In another example, German Patent Application No. DE 10 2014 204 712 A1 discloses an acoustic transducer which is an MEMS. A microphone with a graphene membrane is moreover disclosed.

SUMMARY

Disclosed examples relate to a process for the formation of a graphene membrane component. The process includes the arrangement of a graphene membrane in a relaxed condition of the graphene membrane on a surface of a supportive substrate. The graphene membrane extends across a cut-out with an opening at the surface of the supportive substrate. The graphene membrane may be arranged so that a first portion of the graphene membrane is arranged on the surface of the supportive substrate and a second portion of the graphene membrane is arranged over the opening of the cut-out.

BRIEF DESCRIPTION OF THE DRAWINGS

Embodiments are explained in more detail below with reference to the attached figures.

DETAILED DESCRIPTION OF ILLUSTRATIVE EMBODIMENTS

Figure 1:
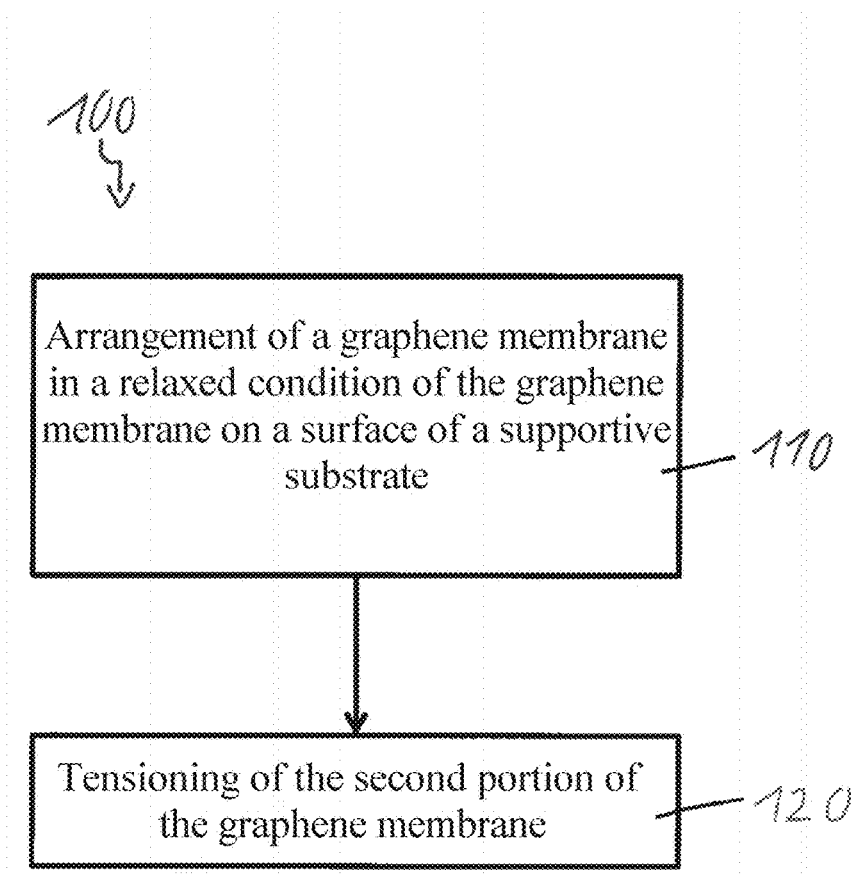
FIG. 1 shows a flow diagram of a process for the formation of a graphene membrane component.

Various embodiments are now described in more detail with reference to the attached drawings depicting some embodiments. The thickness dimensions of lines, layers and/or regions may be exaggerated in the figures for reasons of clarity.

In the description below of the attached figures, which merely show some examples of embodiments, identical reference signs may be used to indicate identical or comparable components. Generic reference signs may moreover be used for components and objects that occur more than once in an embodiment or in a drawing and are described in respect of one or more shared features. Components or objects described by identical or generic reference signs may be identical in respect of individual features, a plurality of features, or all features, for example their dimensions, but where appropriate may also be different, in so far as the description does not explicitly or implicitly reveal anything to the contrary.

Although embodiments can be modified and altered in various ways, embodiments are depicted as examples in the figures, and are described in detail herein. However, it should be made clear that there is no intention to restrict embodiments to the respective forms disclosed, the intention being instead that embodiments cover all of the functional and/or structural modifications, equivalents and alternatives that are within the scope of the invention. Identical reference signs indicate identical or similar elements throughout the description of the figures.

It should be noted when an element is indicated as "connected" or "coupled" to another element, there may be direct connection or coupling to the other element or there may be elements present therebetween. When two elements A and B are combined via the word "or", the intended meaning here is any of the possible combinations, for example "only A", "only B", or else "A and B". An alternative wording for the same combination is "at least one of A and B". The same applies to combinations of more than two elements.

The terminology used herein serves merely for the description of particular embodiments and is not intended to restrict the embodiments. When the singular is used herein, it is intended to include the plural unless the opposite is clearly indicated by the context. It should also be made clear that words such as "includes", "including", "has" and/or "having" as used herein indicate the presence of specified features, whole numbers, steps, operations, elements and/or components, but do not exclude the presence of, or the addition of, one or more features, whole numbers, steps, operations, elements, components and/or groups thereof.

Unless otherwise defined, all of the terms used herein (inclusive of technical and scientific terms) have the meaning attributed thereto by a person of average skill in the art in the field appropriate to the embodiments. It should moreover be made clear that, unless expressly otherwise defined herein, terms such as those defined in dictionaries in general use are to be interpreted as having the meaning that is consistent with their meaning in the context of the relevant technology.

FIG. 1 shows a flow diagram of a process 100 for the formation of a graphene membrane component. The process 100 comprises arrangement no of a graphene membrane in a relaxed condition of the graphene membrane on a surface of a supportive substrate. The graphene membrane extends across a cut-out with an opening at the surface of the supportive substrate. The graphene membrane is moreover arranged so that a first portion of the graphene membrane is arranged on the surface of the supportive substrate and a second portion of the graphene membrane is arranged over the opening of the cut-out. The process 100 moreover comprises tensioning 120 of the second portion of the graphene membrane in order to convert the second portion of the graphene membrane to a tensioned condition, so that, in an operating temperature range of the graphene membrane component, the second portion of the graphene membrane is permanently in the tensioned condition.

By virtue of the arrangement no of the graphene membrane in the relaxed condition of the graphene membrane on the surface of the supportive substrate, it is possible to omit complicated pretensioning of the graphene membrane before arrangement no. It is thus possible to arrange the first portion of the graphene membrane in a particularly efficient and inexpensive manner on the surface of the supportive substrate. By virtue of the fact that, in an operating temperature range of the graphene membrane component, the second portion of the graphene membrane is permanently in the tensioned condition it is moreover possible to omit any complicated equipment for the conversion of the graphene membrane to the tensioned condition during use of the graphene membrane component. It is thus moreover possible to reduce the expense involved in forming the graphene membrane component. By virtue of the permanent tension in the second portion of the grapheme membrane, the resultant graphene membrane component can moreover have improved mechanical, electrical and/or electromechanical properties.

By way of example, the relaxed condition of the graphene membrane can be a condition in which no tensile or tensioning force (or any tensile force or tensioning force markedly smaller than that in the tensioned condition) is exerted onto the graphene membrane in a direction parallel to a surface of the graphene membrane and/or in a direction parallel to the surface of the supportive substrate. The tensioned condition of the second portion of the graphene membrane can by way of example be a condition in which a tensile force or tensioning force is exerted onto the second portion of the graphene membrane in a direction parallel to a surface of the second portion of the graphene membrane and/or in a direction parallel to the surface of the supportive substrate. A (lateral) dimension of the second portion of the graphene membrane in the relaxed condition can by way of example be less than 99% (or less than 95%, less than 92%, less than 90% or less than 85%) of a (lateral) dimension of the second portion of the graphene membrane in the tensioned condition.

By way of example, the operating temperature range can extend at least from 10° C. (or from 5° C., 0° C., −10° C., −20° C., −30° C. or −40° C.) to 30° C. (or to 40° C., 50° C., 60° C., 70° C. or 80° C.). The operating temperature range can by way of example be a range of a temperature of the graphene membrane component or a range of a temperature of an element of the graphene membrane component (for example of the supportive substrate or of the graphene membrane) during use of the graphene membrane component.

By way of example, the graphene membrane can comprise less than 11 atomic graphene layers (or less than 6 or less than 4). The graphene membrane can by way of example be a graphene monolayer. The first portion of the graphene membrane can by way of example surround the second portion of the graphene membrane. By way of example, the first portion of the graphene membrane and the second portion of the graphene membrane can be adjacent to one another. Alternatively, there can be a third portion of the graphene membrane between the first portion of the graphene membrane and the second portion of the graphene membrane. By way of example, the graphene membrane can close (on one side) the cut-out of the supportive substrate. By way of example, the first portion of the graphene membrane can be arranged via inherent adhesion through attraction of the first portion of the graphene membrane on the surface of the supportive substrate. The surface of the supportive substrate can by way of example be a front side of the supportive substrate.

By way of example, a vertical dimension (for example a depth) of the cut-out can be less than 95% of a vertical dimension (for example a thickness) of the supportive substrate (or less than 90%, less than 80%, less than 70% or less than 50%). It is thus possible to include a defined quantity of gas in the cut-out during the formation of the graphene membrane component. By this means it is possible to generate, within the cut-out, a counter pressure for the graphene membrane. Alternatively, the cut-out can penetrate the entirety of the supportive substrate. By way of example, the cut-out can be a via hole in the supportive substrate. The cut-out can by way of example extend vertically from the surface of the supportive substrate into the supportive substrate. By way of example, the opening of the cut-out can be round or elliptical. A tensile force or tensioning force can thus be distributed uniformly onto the second portion of the graphene membrane. A lateral dimension (for example a diameter or a width) of the opening of the cut-out can by way of example be more than 500 nm (or more than 1 µm, more than 10 µm or more than 50 µm) and less than 1 mm (or less than 500 µm or less than 250 µm). By way of example, the lateral dimension of the opening of the cut-out can be from 80 m to 500 µm. By way of example, the second portion of the graphene membrane can close the opening of the cut-out. The shape of the second portion of the graphene membrane can by way of example be the same (for example round or elliptical) as that of the opening of the cut-out. By way of example, the lateral dimensions of the opening of the cut-out can be the same as those of the second portion of the graphene membrane in the tensioned condition.

The graphene membrane can by way of example have a third portion. The third portion of the graphene membrane can lie between the first portion of the graphene membrane and the second portion of the graphene membrane. The tensioning 120 of the second portion of the graphene membrane can moreover be achieved via inherent adhesion through attraction of the third portion of the graphene membrane on at least one portion of a wall of the cut-out. Before the tensioning 120 of the second portion of the graphene membrane, the second portion of the graphene membrane and the third portion of the graphene membrane, in the relaxed condition of the graphene membrane, can be arranged over the opening of the cut-out. By virtue of the inherent adhesion of the first portion of the graphene membrane on at least the portion of the wall of the cut-out, the third portion of the graphene membrane can be drawn from an interior region of the opening of the cut-out in the direction of an edge surrounding the opening of the cut-out.

A tensile force or tensioning force can thus be exerted on the second portion of the graphene membrane in the direction of the edge surrounding the opening of the cut-out. By means of this tensile force or tensioning force, the second portion of the graphene membrane can be converted to the tensioned condition. By way of example, the inherent adhesion between the graphene membrane and the supportive substrate can be brought about by Van der Waals forces, hydrogen-bonding forces and/or dipole forces. The third portion of the graphene membrane can by way of example surround the second portion of the graphene membrane. By way of example, the first portion of the graphene membrane can surround the third portion of the graphene membrane. The wall of the cut-out can by way of example extend from the surface of the supportive substrate vertically as far as a floor of the cut-out, or as far as another opening of the cut-out at another surface (for example a reverse side) of the supportive substrate. The wall of the cut-out can by way of example surround the entirety of the cut-out. A vertical dimension of the portion of the wall can be less than 11% of a lateral dimension (for example a diameter or a width) of the opening of the cut-out (or less than 10%, less than 5% or less than 3%). Alternatively, the third portion of the graphene membrane can cover the entirety of the wall of the cut-out.

The supportive substrate can by way of example comprise an adhesive layer. The adhesive layer can form at least one portion of the surface of the supportive substrate on which the first portion of the graphene membrane is arranged, and that portion of the wall on which the third portion of the graphene membrane adheres. The energy of adhesion between the graphene membrane and the adhesive layer can moreover be more than 250 mJ per $m^2$ (or more than 300 mJ per $m^2$, more than 400 mJ per $m^2$, or more than 450 mJ per $m^2$). It is thus possible to improve adhesion of the first portion of the graphene membrane on the surface of the supportive substrate and adhesion of the third portion of the graphene membrane on the portion of the wall of the cut-out. By way of example, a vertical dimension (for example a thickness) of the adhesive layer can be less than 11% of a lateral dimension (for example a diameter or a width) of the opening of the cut-out (or less than 10%, less than 5% or less than 3%). The vertical dimension of the adhesive layer can by way of example be more than 2 nm (or more than 5 nm, more than 10 nm, more than 100 nm, more than 1 μm, more than 10 μm, more than 100 μm or more than 200 μm). The adhesive layer can by way of example comprise at least one of silicon oxide, silicon nitride and aluminium oxide. Alternatively, the supportive substrate can be composed entirely of a substrate material of which the energy of adhesion to graphene is more than 250 mJ per $m^2$ (or more than 300 mJ per $m^2$, more than 400 mJ per $m^2$, or more than 450 mJ per $m^2$). The supportive substrate can by way of example be composed entirely of silicon oxide, silicon nitride and/or aluminium oxide.

The adhesive layer can by way of example be adjacent to a bulk region of the supportive substrate. By way of example, a vertical dimension (for example a thickness) of the bulk region of the supportive substrate can be more than 200 μm (or more than 300 μm, more than 500 μm or more than 750 μm) and less than 1 mm (or less than 900 μm or less than 800 μm). The vertical dimension of the bulk region of the supportive substrate can by way of example be 775 μm.

The bulk region of the supportive substrate can by way of example be composed of a semiconductor substrate. By way of example, the semiconductor substrate comprises at least one of silicon, hydrogen-passivated silicon, silicon carbide, gallium arsenide, gallium nitride, and germanium. Alternatively, the bulk region of the supportive substrate can be composed of a non-conductive substrate (for example a glass substrate or a quartz-glass substrate). The cut-out in the non-conductive substrate can by way of example be lined with a semiconductor material or with a polymer; (by way of example, the wall of the cut-out can be coated at least to some extent with the semiconductor material or with the polymer). By way of example, the semiconductor material comprises at least one of silicon, hydrogen-passivated silicon, silicon carbide, gallium arsenide, gallium nitride, and germanium.

The graphene membrane and the supportive substrate can by way of example have different coefficients of thermal expansion. The arrangement 110 of the graphene membrane in the relaxed condition of the graphene membrane on the surface of the supportive substrate can be carried out at a first temperature. The tensioning 120 of the second portion of the graphene membrane can moreover comprise heating or cooling of the supportive substrate and of the graphene membrane to a second temperature. The heating or cooling of the supportive substrate and of the graphene membrane to the second temperature can bring about a change in the dimensions of the second portion of the graphene membrane and a change in the dimensions of the supportive substrate. Because the graphene membrane and the supportive substrate have different coefficients of thermal expansion, the change in dimensions of the second portion of the graphene membrane can differ greatly from the change in dimensions of the supportive substrate. During the heating or cooling of the supportive substrate and of the graphene membrane to the second temperature, the first portion of the graphene membrane is arranged on the surface of the supportive substrate and thus adheres thereto, and it is therefore possible to convert the second portion of the graphene membrane to the tensioned condition via the different changes in dimensions of the second portion of the graphene membrane and of the supportive substrate. By way of example, the first temperature can be above 60° C. (or above 80° C. or above 100° C.). Alternatively, the first temperature can be below −15° C. (or below −20° C. or below −30° C.). The second temperature can by way of example be within the operating temperature range. The graphene membrane can by way of example have a negative coefficient of thermal expansion. By way of example, the graphene membrane can have a coefficient of thermal expansion of more than −8 ppm per K and less than −6 ppm per K at room temperature. The coefficient of thermal expansion of the graphene membrane can by way of example be smaller than the coefficient of thermal expansion of the supportive substrate.

Arrangement 110 of the graphene membrane on the surface of the supportive substrate can by way of example comprise transfer of the graphene membrane (or of graphene) onto the supportive substrate with use of a transfer substrate with a coefficient of thermal expansion differing from that of the graphene membrane. The supportive substrate can be any desired supportive substrate. By conducting the transfer at a temperature different from an ambient temperature (or an operating temperature or usage temperature of the graphene membrane component), internal tension can be produced in the graphene membrane. After heating or cooling to ambient temperature, the tension can be maintained by virtue of the adhesion of the graphene membrane on the surface of the supportive substrate (or on the supportive substrate).

By way of example, arrangement 110 of the graphene membrane in the relaxed condition of the graphene membrane on the surface of the supportive substrate can comprise placing of the graphene membrane on a surface of a liquid and bringing the supportive substrate into contact with the graphene membrane placed on the surface of the liquid. By virtue of the placing of the graphene membrane on the surface of the liquid it is possible to omit any complicated use of a transfer substrate to transfer the graphene membrane to the surface of the supportive substrate. It is thus possible to achieve inexpensive formation of the graphene membrane component. The liquid can by way of example be water. The pH of the liquid can by way of example be in the range from 3 (or from 4, from 5 or from 6) to 9 (or to 8 or to 7). The supportive substrate can by way of example be arranged below or above the surface of the liquid. The supportive substrate can by way of example be introduced into the liquid before the supportive substrate is brought into contact with the graphene membrane.

It is possible by way of example that establishment of contact between the supportive substrate and the graphene membrane comprises changing the level of the surface of the liquid. It is thus possible to avoid any complicated motion of the supportive substrate in order to establish contact between the supportive substrate and the graphene membrane. In the event that the supportive substrate is arranged below the surface of the liquid, the change in the level of the surface of the liquid can by way of example be a lowering of the level of the surface of the liquid. In the event that the supportive substrate is arranged above the surface of the liquid, the change of the level of the surface of the liquid can by way of example be a rise in the level of the surface of the liquid.

It is possible by way of example that establishment of contact between the supportive substrate and the graphene membrane comprises motion of the supportive substrate in the direction of the surface of the liquid.

Before the arrangement 110 of the graphene membrane on the surface of the supportive substrate, the graphene membrane can by way of example be arranged on a supportive membrane. The process 100 can moreover comprise removal of the supportive membrane after the arrangement 110 of the graphene membrane on the surface of the supportive substrate or after the tensioning 120 of the second portion of the graphene membrane. Use of the supportive membrane can avoid undesired deformation of the graphene membrane during arrangement 110 of the graphene membrane on the surface of the supportive substrate. The supportive membrane can by way of example comprise at least one of polymethyl methacrylate, polycarbonate, polystyrene and any other suitable membrane material. The thickness of the supportive membrane can by way of example be more than 500% of the thickness of the graphene membrane (or more than 1000%). The supportive membrane can by way of example be removed by means of a solvent (for example acetone).

The arrangement 110 of the graphene membrane in the relaxed condition of the graphene membrane on the surface of the supportive substrate can by way of example comprise arrangement of the graphene membrane on a surface of a pressure-applying device and pressing of the pressure-applying device onto the surface of the supportive substrate. It is thus possible to carry out arrangement 110 of the graphene membrane on the surface of the supportive substrate in a dry environment. The pressure-applying device can by way of example be pressed with a force of more than 1 N (or more than 10 N) and less than 1 kN (or less than 100 N) onto the surface of the supportive substrate.

The energy of adhesion between the surface of the pressure-applying device and the graphene membrane can by way of example be less than 90% of the energy of adhesion between the first portion of the graphene membrane and the surface of the supportive substrate (or less than 75%, less than 50% or less than 25%). By virtue of the different energies of adhesion, the graphene membrane can adhere more strongly on the surface of the supportive substrate than on the surface of the pressure-applying device. It is thus possible, after the pressure-applying device has been pressed onto the surface of the supportive substrate, to release the graphene membrane from the surface of the pressure-applying device by moving the pressure-applying device away from the surface of the supportive substrate. The pressure-applying device can by way of example have a polymethylsiloxane layer which forms the surface of the pressure-applying device.

The pressure-applying device can by way of example comprise a thermal release element. The arrangement 110 of the graphene membrane in the relaxed condition of the graphene membrane on the surface of the supportive substrate can moreover comprise heating of the thermal release element in order to release the graphene membrane form the surface of the pressure-applying device. Use of a thermal release element permits stronger adhesion of the graphene membrane on the pressure-applying device. It is thus possible to avoid any unintended release of the graphene membrane from the pressure-applying device. The thermal release element can by way of example be a thermally releasable adhesive film which loses its adhesive property when the thermally releasable adhesive film is heated above a predetermined temperature (for example on heating of the adhesive film above 90° C., above 100° C. or above 120° C.).

The arrangement 110 of the graphene membrane in the relaxed condition of the graphene membrane on the surface of the supportive substrate can by way of example be carried out at a relative humidity above 35% (above 40%, above 50%, above 60%, above 70%, above 80% or above 90%). Adhesion of the graphene membrane to the surface of the supportive substrate can thereby by improved. Arrangement 110 of the graphene membrane on the surface of the supportive substrate can for example be carried out in a humid atmosphere or after use of steam to form tiny droplets on the surface of the supportive substrate.

By way of example, the vertical direction or a vertical dimension or a depth perpendicularly to the surface of the supportive substrate may be subjected to measurement, and a lateral direction or a lateral dimension parallel to the surface of the supportive substrate may be subjected to measurement.

Figure 2A:
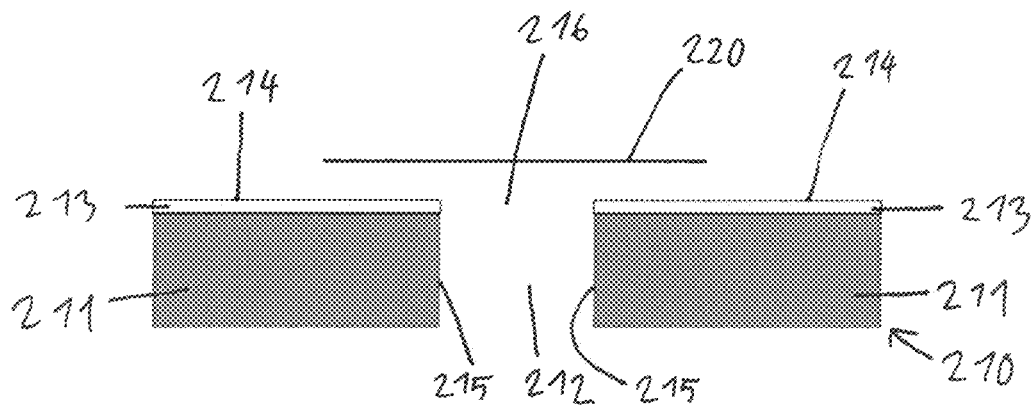
FIGS. 2a to 2c show a diagram of a process sequence for the formation of a graphene membrane component.
Figure 2B:
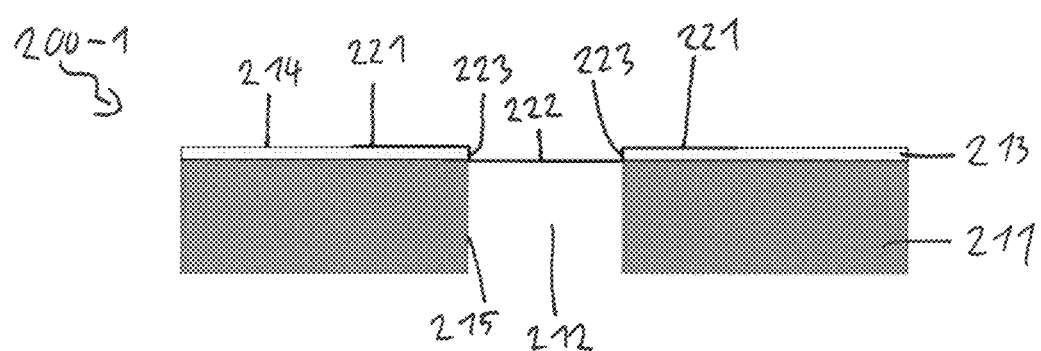
Figure 2C:
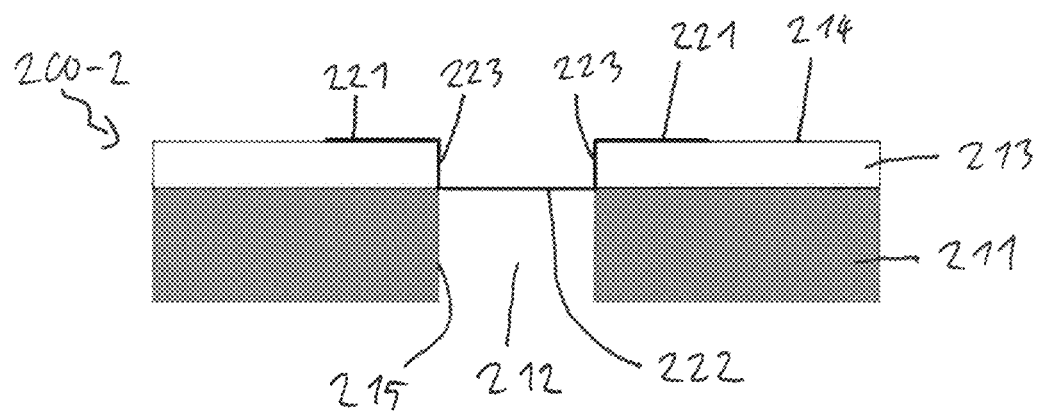

FIGS. 2*a* to 2*c* are diagrams of a process sequence for the formation of a graphene membrane component 200. The formation of the graphene membrane components 200 can be carried out in a manner similar to the process 100 described in connection with FIG. 1 for the formation of a graphene membrane component.

FIG. 2*a* shows a supportive substrate 210 and a graphene membrane 220 before arrangement 110 of the graphene membrane 220 on a surface 214 of the support substrate 210. The supportive substrate 210 comprises a bulk region 211, a cut-out 212 which penetrates the entirety of the supportive substrate 210, and an opening 216, and an adhesive layer 213. The bulk region 211 can by way of example comprise silicon (Si) and the adhesive layer 213 can by way of example comprise silicon oxide (SiO2). The adhesive layer 213 forms the surface 214 of the supportive substrate 210, and also a portion of a wall 215 of the cut-out.

FIG. 2b shows a graphene membrane component 200-1 after tensioning 120 of a second portion 222 of the graphene membrane 220. A first portion 221 of the graphene membrane 220 is arranged on the surface 214 of the supportive substrate 210. The second portion 222 of the graphene membrane 220 has moreover been applied over the cut-out 212. A third portion 223 of the graphene membrane 220 inherently adheres on that portion of the wall 215 formed by the adhesive layer 213. By virtue of the inherent adhesion of the third portion 223 of the graphene membrane 220 on that portion of the wall 215 formed by the adhesive layer 213 it is possible to tension the second portion 222 of the graphene membrane 220.

Inherent adhesion of the third portion 223 of the graphene membrane 220 or of the second portion 222 of the graphene membrane 220 on that portion of the wall 215 formed by the bulk region 211 of the supportive substrate 210 can by way of example be avoided by adjusting the adhesion of the graphene membrane 220 on that portion of the wall 215 formed by the bulk region 211 of the supportive substrate 210 so that it is smaller than the tensile force or tensioning force acting on the second portion 222 of the graphene membrane 220 in the tensioned condition. To this end, the materials of the adhesive layer 213 and the bulk region 211 can by way of example be selected in such a way that the energy of adhesion between the adhesive layer 213 and the graphene membrane 220 is markedly greater than the energy of adhesion between the bulk region 211 and the graphene membrane 220.

It is possible that by way of example by virtue of the attractive forces (for example Van der Waals forces) acting between the adhesive layer 213 and the graphene membrane 220 the graphene membrane 220 is drawn into the cut-out 212 as far as a transition between the adhesive layer 213 and the bulk region 211 on the wall 215. Since the first portion 221 of the graphene membrane 220 adheres securely on the surface 214, drawing of the graphene membrane 220 to some extent into the cut-out 212 can bring about the tensioning 120 of the second portion 222 of the graphene membrane 220. It is moreover possible (for a fixed width of the opening 216 of the cut-out 212) to achieve efficient adjustment of the tensile force or tensioning force exerted on the second portion 222 of the graphene membrane 220 by way of the thickness of the adhesive layer 213 (for example by way of a vertical distance from the surface 214 to the transition between the adhesive layer 213 and the bulk region 211).

FIG. 2c shows another graphene membrane component 200-2 after the tensioning 120 of the second portion 222 of the graphene membrane 220. The thickness of the adhesive layer 213 of the graphene membrane component 200-2 is greater than that of the adhesive layer 213 of the graphene membrane component 200-1. The second portion 222 of the graphene membrane 220 of the graphene membrane component 200-2 can therefore be subjected to greater tensioning than the second portion 222 of the graphene membrane 200 of the graphene membrane component 200-1.

FIGS. 2a to 2c show examples of diagrams of cross sections of free-standing graphene membranes 220 on an SiO2/Si substrate (for example on the supportive substrate 210) with varying SiO2 film thickness (for example with varying thickness of the adhesive layer 213).

By way of example, the graphene membrane 220 can, unlike other materials, for example silicon (Si, energy of adhesion 151 mJ per m²), adhere very successfully to silicon oxide (SiO2) (energy of adhesion 450 mJ per m²). This adhesion can be assisted by formation of an intervening water layer, which forms on hydrophilic silicon oxide (SiO2), but not on hydrophobic silicon (Si). When the graphene membrane 220 (or a graphene layer) is applied over the cut-out 212 (or a hole) in a supportive substrate 210 which is composed of silicon (Si) and which is covered by the adhesive layer 213 (or by an SiO2 film), the graphene membrane 220 can follow the surface of the adhesive layer 213 (or the SiO2 surface) until the latter reaches the underlying bulk region 211 (or Si portion) of the cut-out 212. During this application the graphene membrane can be subject to a tensile stress, which can be adjusted via the thickness of the adhesive layer 213. The resultant tension can be calculated as follows:

$$\text{Tension in } \% = \frac{2d + W}{W} - 1 = \frac{2d}{W}$$

where d indicates the thickness of the adhesive layer 213 and W indicates the width of the cut-out 212 (or of a via hole).

The graphene membrane 220 can by way of example be applied in various ways. The general structure can be composed of a supportive substrate 210 which comprises cut-outs 212 (for example via holes), with a combination of hydrophilic and hydrophobic surface materials or other materials systems having different energies of adhesion on graphene. The hydrophobic material can by way of example be silicon, in particular after passivation by hydrogen, and the hydrophilic material can by way of example be SiO2, Si3N4 or Al2O3.

Further details and aspects are mentioned in conjunction with the embodiments described above or below. The embodiment shown in FIGS. 2a to 2c can comprise one or more optional additional features corresponding to one or more aspects mentioned in connection with the proposed concept or with one or more of the embodiments described above (for example FIG. 1) or below (for example FIGS. 3a-8).

Figure 3A:
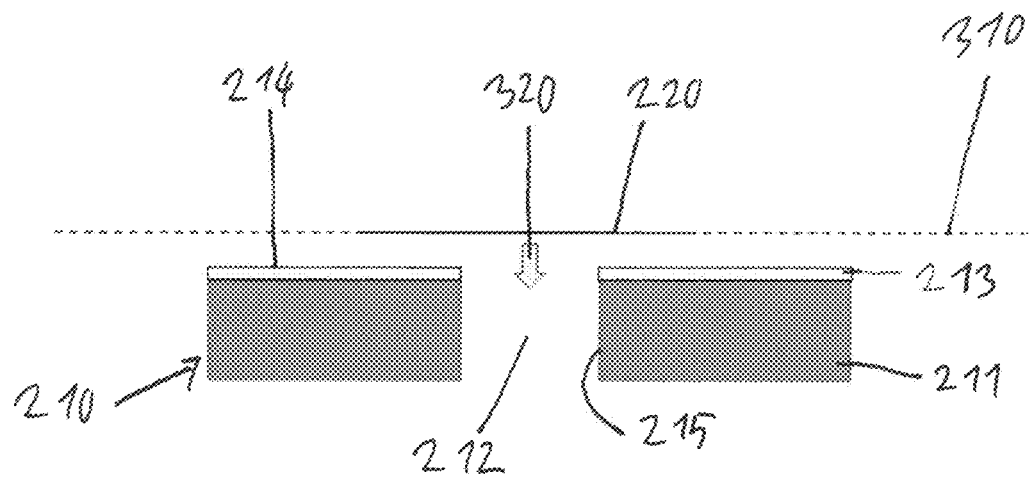
FIGS. 3a and 3b show a diagram of another process sequence for the formation of another graphene membrane component.
Figure 3B:
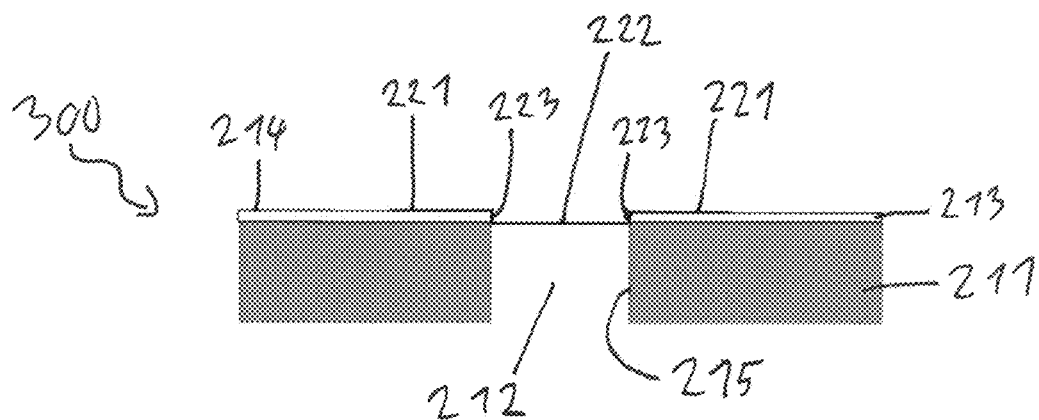

FIGS. 3a and 3b show another diagram of a process sequence for the formation of another graphene membrane component 300. The graphene membrane component 300 can be formed in a manner similar to that in the process 100 described in connection with FIG. 1 for the formation of a graphene membrane component.

FIG. 3a shows a supportive substrate 210 and a graphene membrane 220 before arrangement 110 of the graphene membrane 220 on a surface 214 of the supportive substrate 210. The graphene membrane 220 has been placed on a surface 310 of a liquid. The supportive substrate 210 has moreover been introduced into the liquid. The design of the supportive substrate 210 can be the same as that of the supportive substrate 210 described in connection with FIG. 2a. As indicated by an arrow 320, the graphene membrane 220 can be brought into contact with the supportive substrate 210 by lowering the level of the surface of the liquid.

FIG. 3b shows the graphene membrane component 300 after the graphene membrane 220 has been brought into contact with the supportive substrate 210. The design of the graphene membrane component 300 can be the same as that of the graphene membrane component 200-1 described in connection with FIG. 2b. Since the cut-out 212 penetrates the entire supportive substrate 210, any quantity of liquid remaining in the cut-out 212 after the level of the surface of the liquid has been lowered can easily be removed. Liquid residues remaining on the graphene membrane component 300 can moreover by way of example be removed by careful and slow drying at room temperature.

FIGS. 3a and 3b show an example of a wet transfer principle without supportive membrane. By way of example, wet transfer of the graphene membrane 220 (or of graphene) can be carried out onto the supportive substrate 210. In the absence of any supportive membrane, the graphene membrane 220 (or a graphene layer) here can float on the surface 310 of the liquid and come to rest on the supportive substrate 210 when the supportive substrate 210 approaches the surface 310 of the liquid.

Further details and aspects are mentioned in conjunction with the embodiments described above or below. The embodiment shown in FIGS. 3a and 3b can comprise one or more optional additional features corresponding to one or more aspects mentioned in connection with the proposed concept or with one or more of the embodiments described above (for example FIGS. 1-2c) or below (for example FIGS. 4a-8).

Figure 4A:
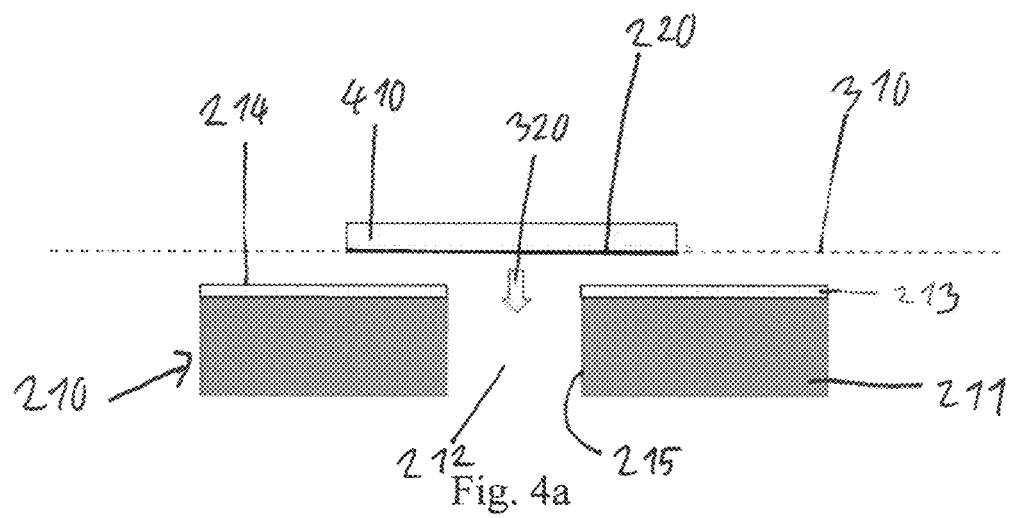
FIGS. 4a to 4c show a diagram of another process sequence for the formation of another graphene membrane component.
Figure 4B:
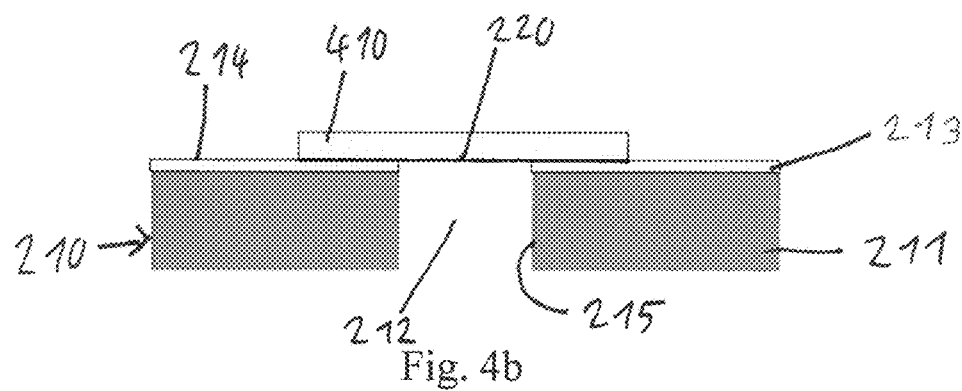
Figure 4C:
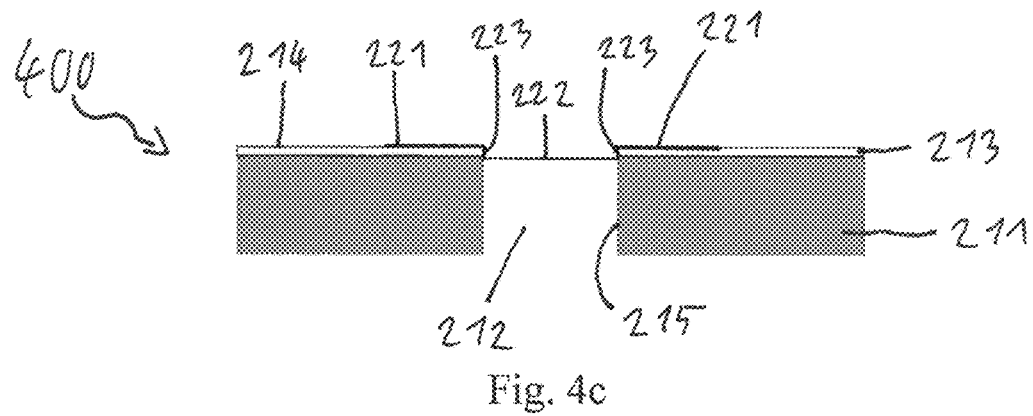

FIGS. 4a to 4c show another diagram of a process sequence for the formation of another graphene membrane component 400. The graphene membrane component 400 can be formed in a manner similar to that in the process 100 described in connection with FIG. 1 for the formation of a graphene membrane component.

FIG. 4a shows a supportive substrate 210 and a graphene membrane 220 arranged on a supportive membrane 410, before arrangement 110 of the graphene membrane 220 on a surface 214 of the supportive substrate 210. The graphene membrane 220 has been placed on a surface 310 of a liquid. The supportive substrate 210 has moreover been introduced into the liquid. The design of the supportive substrate 210 can be the same as that of the supportive substrate 210 described in connection with FIG. 2a. As indicated by an arrow 320, the graphene membrane 220 arranged on the supportive membrane 410 can be brought into contact with the supportive substrate 210 by lowering the level of the surface of the liquid. The supportive membrane 410 can by way of example be a polymer support.

FIG. 4b shows the supportive substrate 210 after the graphene membrane 220 arranged on the supportive membrane 410 has been arranged on the surface 214 of the supportive substrate. The supportive membrane 410 can be removed from the graphene membrane 220 in a subsequent step. By way of example, a solvent (such as acetone) can be used to remove the supportive membrane 410. A second portion 222 of the graphene membrane 220 can then be tensioned.

FIG. 4c shows the graphene membrane component 400 after the tensioning 120 of the second portion 222 of the graphene membrane 220. The design of the graphene membrane component 400 can be the same as that of the graphene membrane component 200-1 described in connection with FIG. 2b.

FIGS. 4a to 4c show an example of a wet transfer principle with supportive membrane 410. By way of example, wet transfer of the graphene membrane 220 (or of graphene) can be carried out onto the supportive substrate 210. The graphene membrane 220 here (or a graphene layer), with the supportive membrane 410, which can comprise a polymer (for example polymethylmethacrylate (PMMA)) or another material, can float on a surface 310 of the liquid and come to rest on the supportive substrate 210 when the supportive substrate 210 approaches the surface 310 of the liquid. A solvent (such as acetone) can then be used to remove the supportive membrane 410.

Further details and aspects are mentioned in conjunction with the embodiments described above or below. The embodiment shown in FIGS. 4a to 4c can comprise one or more optional additional features corresponding to one or more aspects mentioned in connection with the proposed concept or with one or more of the embodiments described above (for example FIGS. 1-3b) or below (for example FIGS. 5a-8).

Figure 5A:
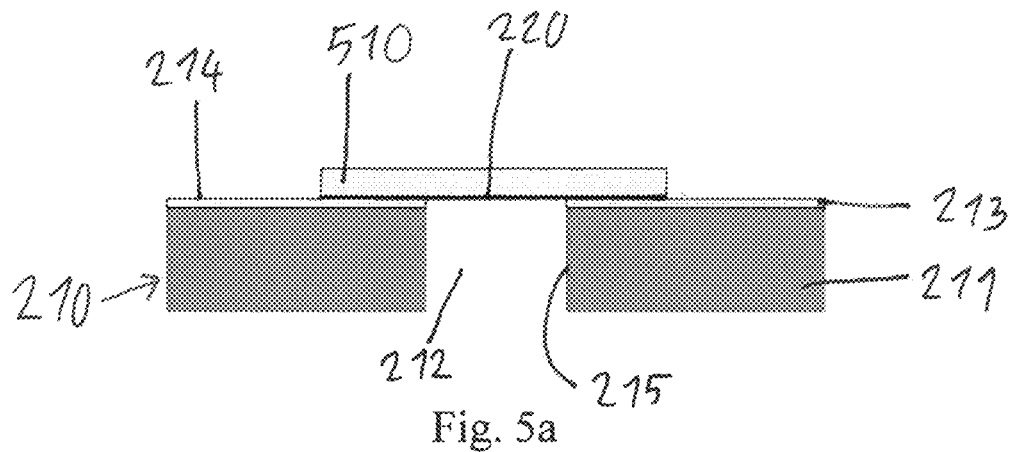
FIGS. 5a to 5c show is a diagram of another process sequence for the formation of another graphene membrane component.
Figure 5B:
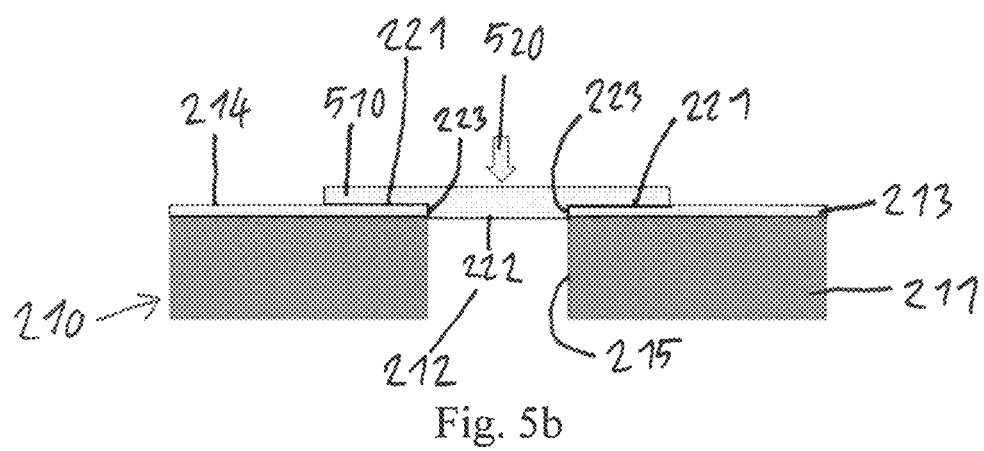
Figure 5C:
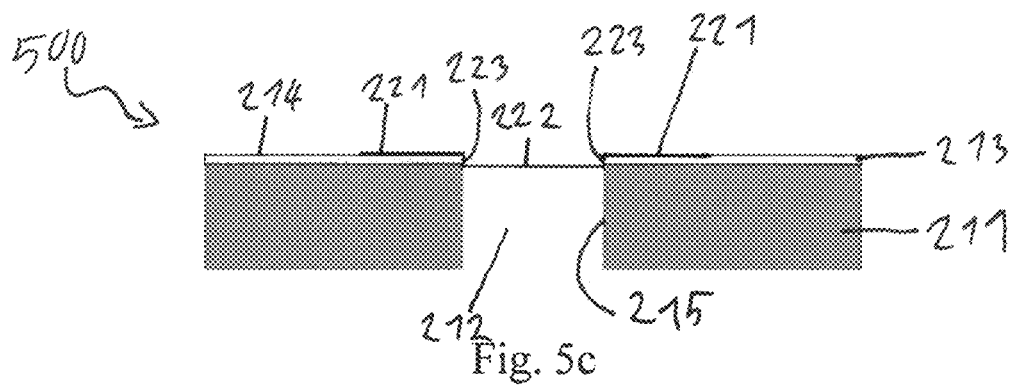

FIGS. 5a to 5c show another diagram of a process sequence for the formation of another graphene membrane component 500. The graphene membrane component 500 can be formed in a manner similar to that in the process 100 described in connection with FIG. 1 for the formation of a graphene membrane component.

FIG. 5a shows a supportive substrate 210 and a graphene membrane 220 arranged on a surface of a pressure-applying device 510 during arrangement 110 of the graphene membrane 220 on a surface 214 of the supportive substrate 210. The design of the supportive substrate 210 can be the same as that of the supportive substrate 210 described in connection with FIG. 2a. The pressure-applying device 510 can by way of example be a pressure-applying device made of polymer.

FIG. 5b shows the supportive substrate 210 and the graphene membrane 220 arranged on the surface of the pressure-applying device 510 during pressing, symbolized by an arrow 520, of the pressure-applying device 510 against the supportive substrate 210. A first portion 221 of the graphene membrane 220 is arranged on the surface 214 of the supportive substrate 210. A second portion 222 of the graphene membrane 220 has moreover been applied over the cut-out 212. A third portion 223 of the graphene membrane 220 inherently adheres on that portion of the wall 215 formed by the adhesive layer 213. The energy of adhesion between the surface of the pressure-applying device 510 and the graphene membrane 220 can by way of example be less than 90% of the energy of adhesion between the first portion 221 of the graphene membrane 220 and the surface 214 of the supportive substrate 210.

FIG. 5c shows the graphene membrane component 500 after removal of the graphene membrane 220 from the surface of the pressure-applying device 510. The graphene membrane 220 can by way of example be removed from the surface of the pressure-applying device 510 by moving the pressure-applying device 510 away from the surface 214 of the supportive substrate 210. The design of the graphene membrane component 500 can be the same as that of the graphene membrane component 200-1 described in connection with FIG. 2b.

FIGS. 5a to 5c show an example of a dry transfer principle. A dry transfer can by way of example be carried out with use of the pressure-applying device 510 (or of a pressure-applying implement) composed of a material with relatively small adhesive strength (for example polydimethylsiloxane (PDMS)) for graphene compared to the surface 214 of the supportive substrate 210 (for example as SiO2).

Further details and aspects are mentioned in conjunction with the embodiments described above or below. The embodiment shown in FIGS. 5a to 5c can comprise one or more optional additional features corresponding to one or more aspects mentioned in connection with the proposed concept or with one or more of the embodiments described above (for example FIGS. 1-4c) or below (for example FIGS. 6-8).

Figure 6:
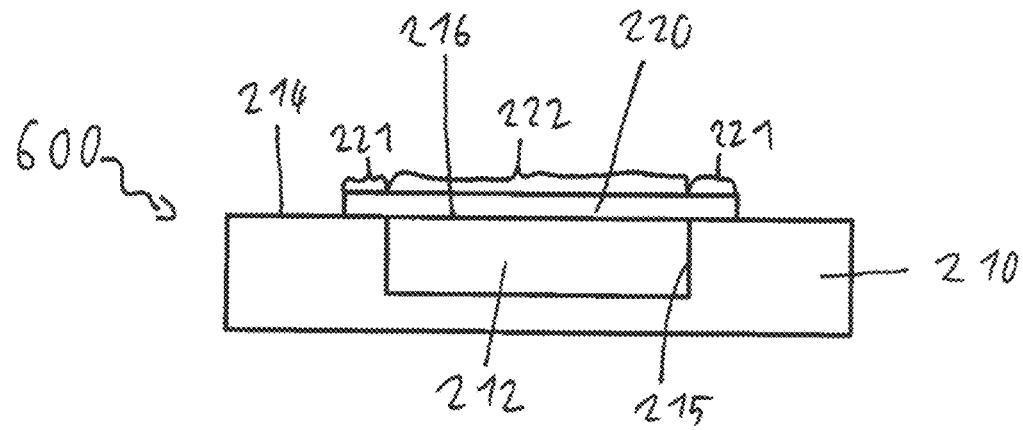
FIG. 6 is a diagram of a cross section of another graphene membrane component.

FIG. 6 is a diagram of a cross section of another graphene membrane component 600. The graphene membrane component 600 comprises a supportive substrate 210 with a cut-out 212 with an opening 216 on a surface 214 of the supportive substrate 210. The graphene membrane component 600 moreover comprises a graphene membrane 220 arranged on the surface 214 of the supportive substrate 210. The graphene membrane 220 extends across the cut-out 212 of the supportive substrate 210. The graphene membrane 220 is moreover arranged so that a first portion 221 of the graphene membrane 220 is arranged on the surface 214 of the supportive substrate 210 and a second portion 222 of the graphene membrane 220 is arranged at the opening 216 of the cut-out 212. In an operating temperature range of the graphene membrane component 600, the second portion 222 of the graphene membrane 220 is moreover permanently in a tensioned condition.

By virtue of the fact that, in the operating temperature range of the graphene membrane component 600, the second portion 222 of the graphene membrane 220 is permanently in the tensioned condition, it is possible to omit any complicated device for the tensioning of the second portion 222 of the graphene membrane 220 during use of the graphene membrane component 600. It is thus possible to reduce the expense involved in producing the graphene membrane component 600. Omission of the device for the tensioning of the second portion 222 of the graphene membrane 220 can moreover reduce consumption of electrical energy by the graphene membrane component 600 during use of the graphene membrane component 600. By virtue of the permanent tension in the second portion 222 of the graphene membrane 220, the graphene membrane component 600 can moreover have improved mechanical, electrical and/or electromechanical properties.

The depth of the cut-out 212, shown in FIG. 6, in the supportive substrate 210 is less than the thickness of the supportive substrate 210. There can moreover be a predetermined quantity of gas enclosed in the cut-out 212. It is thus possible to generate, within the cut-out 212, a counter pressure for the second portion 222 of the graphene membrane 220. Alternatively, the cut-out 212 can penetrate the entire supportive substrate 210. By way of example, the graphene membrane component 600 can be formed by means of the process 100, described in connection with FIG. 1, for the formation of a graphene membrane component. The graphene membrane component 600 can by way of example be an element of a microphone, of a Hall-effect sensor, of an MEMS, of a pressure sensor or of a loudspeaker.

The graphene membrane 220 can by way of example have a third portion. The third portion of the graphene membrane 220 can lie between the first portion 221 of the graphene membrane 220 and the second portion 222 of the graphene membrane 220. The third portion of the graphene membrane 220 can moreover inherently adhere on at least one portion of a wall 215 of the cut-out 212. The second portion 222 of the graphene membrane 220 can be maintained permanently in the tensioned condition by the inherent adhesion of the third portion of the graphene membrane 220 on at least the portion of a wall 215.

A vertical dimension of that portion of the wall 215 of the cut-out 212 on which the third portion of the graphene membrane 220 adheres can by way of example be more than 0.5% of a lateral dimension of the opening 216 of the cut-out 212 (Or more than 1%, more than 5% or more than 10%). The second portion 222 of the graphene membrane 220 can thus be subjected to greater tension. The lateral dimension of the opening 216 can by way of example be a width or a diameter of the opening 216.

The supportive substrate 210 can by way of example comprise an adhesive layer which forms at least a portion of the surface 214 of the supportive substrate 210 on which the first portion 221 of the graphene membrane 220 is arranged, and which forms that portion of the wall 215 on which the third portion of the graphene membrane 220 adheres. The energy of adhesion between the graphene membrane 220 and the adhesive layer can moreover be more than 250 mJ per m$^2$ (or more than 300 mJ per m$^2$, more than 400 mJ per m$^2$, or more than 450 mJ per m$^2$). It is thus possible to improve adhesion of the first portion 221 of the graphene membrane 220 on the surface 214 of the supportive substrate 210 and adhesion of the third portion of the graphene membrane 220 on the portion of the wall 215 of the cut-out 212. By way of example, the vertical dimension (for example a thickness) of the adhesive layer can be less than 11% of a lateral dimension (for example a diameter or a width) of the opening 216 of the cut-out 212 (or less than 10%, less than 5% or less than 3%). The vertical dimension of the adhesive layer can by way of example be more than 2 nm (or more than 5 nm, more than 10 nm, more than 100 nm, more than 1 µm, more than 10 µm, more than 100 µm or more than 200 µm). The adhesive layer can by way of example comprise at least one of silicon oxide, silicon nitride and an aluminium oxide.

The energy of adhesion between the graphene membrane 220 and a surface of a bulk region of the supportive substrate 210 within the cut-out 212 can by way of example be less than 200 mJ per m$^2$ (or less than 150 mJ per m$^2$, less than 100 mJ per m$^2$ or less than 50 mJ per m$^2$). It is thus possible to bring about release of the third portion of the graphene membrane 220 from the wall 215 of the cut-out 212 in the region of the surface of the bulk region of the supportive substrate 210 within the cut-out 212. It is thus possible to adjust the tension of the second portion 222 of the graphene membrane 220 via the thickness of the adhesive layer and the width of the cut-out 212. The supportive substrate 210 at the surface of the bulk region within the cut-out 212 can by way of example comprise at least one of silicon, hydrogen-passivated silicon, silicon carbide, gallium arsenide, gallium nitride, germanium and a polymer.

A number of atomic graphene layers in the graphene membrane 220 can by way of example be less than 11 (or less than 6 or less than 4). The graphene membrane 220 can by way of example be a graphene monolayer.

Further details and aspects are mentioned in conjunction with the embodiments described above or below. The embodiment shown in FIG. 6 can comprise one or more optional additional features corresponding to one or more aspects mentioned in connection with the proposed concept or with one or more of the embodiments described above (for example FIGS. 1-5c) or below (for example FIGS. 7-8).

Figure 7:
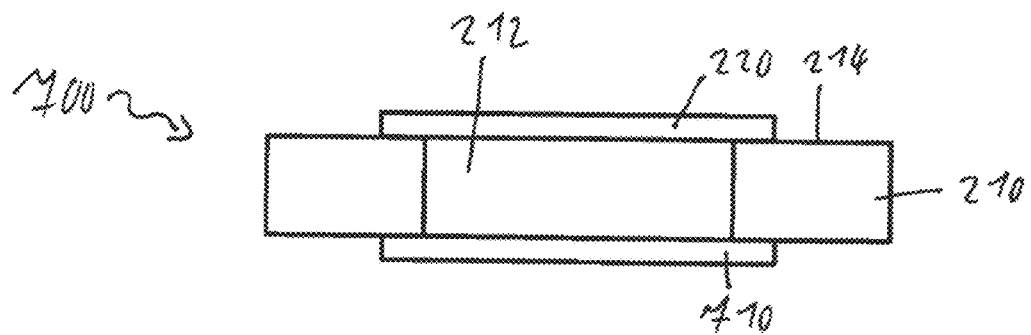
FIG. 7 is a diagram of a cross section of a microphone.

FIG. 7 is a diagram of a cross section of a microphone 700. The microphone 700 comprises a graphene membrane component and a counter electrode 710. The counter electrode 710 can by way of example be porous in order to bring about depressurization. The microphone 700 can be very robust by virtue of the use of the graphene membrane component. The microphone 700 can moreover have particularly small geometric dimensions. The microphone 700 can moreover provide advantageous and reproducible properties via defined, to some extent high, loading of the graphene membrane 220. The microphone 700 can by way of example be a capacitor microphone, a graphene microphone or a microphone using an electrostatic or piezoresistive principle of operation.

The graphene membrane component comprises a supportive substrate 210 with a cut-out 212, and comprises a graphene membrane 220 arranged on a surface 214 of the supportive substrate 210. The design of the graphene membrane component can by way of example be the same as that of the graphene membrane component 200-1 described in connection with FIG. 2b or that of the graphene membrane component 600 described in connection with FIG. 6. It is possible by way of example to use a free-standing graphene membrane 220 in the microphone 700. The counter electrode 710 can by way of example comprise an electrically conductive material (for example copper, aluminium, gold, tungsten, titanium, tantalum or polysilicon).

Further details and aspects are mentioned in conjunction with the embodiments described above or below. The embodiment shown in FIG. 7 can comprise one or more optional additional features corresponding to one or more aspects mentioned in connection with the proposed concept or with one or more of the embodiments described above (for example FIGS. 1-6) or below (for example FIG. 8).

Figure 8:
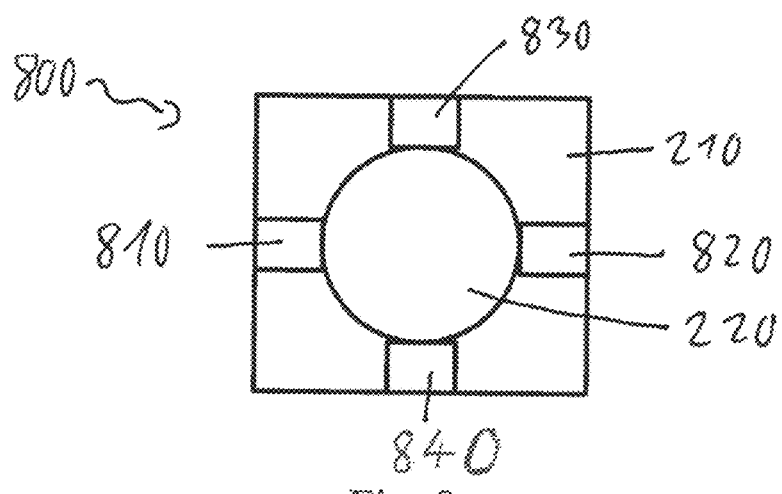
FIG. 8 is a diagram of a plan view of a Hall-effect sensor.

FIG. 8 is a diagram of a plan view of a Hall-effect sensor 800. The Hall-effect sensor 800 comprises a graphene membrane component with a graphene membrane 220 arranged on a surface of a supportive substrate 210, and also four contacts 810, 820, 830, 840 arranged on the supportive substrate 210. By virtue of the use of the graphene membrane component, the Hall-effect sensor 800 can have high sensitivity and low energy consumption. The Hall-effect sensor 800 can moreover provide advantageous and reproducible properties via defined, to some extent, high, loading of the graphene membrane 200. The design of the graphene membrane component can by way of example be the same as that of the graphene membrane component 200-1 described in connection with FIG. 2b or that of the graphene membrane component 600 described in connection with FIG. 6. It is possible by way of example to use a free-standing graphene membrane 220 in the Hall-effect sensor 800. The Hall-effect sensor 800 can by way of example be a graphene Hall-effect sensor.

The shape of the graphene membrane 220 shown in FIG. 8 is circular. Alternatively, the graphene membrane 220 can have any desired other shape. By way of the contacts 810 and 820 it is possible by way of example to apply a supply voltage to the graphene membrane 220, in order to bring about flow of current through the graphene membrane 220 from the contact 810 to the contact 820. At the contacts 830 and 840 it is moreover possible to measure a decrease in Hall-effect voltage when the location of the Hall-effect sensor 800 is in a magnetic field running perpendicularly to the flow of current.

Further details and aspects are mentioned in conjunction with the embodiments described above or below. The embodiment shown in FIG. 8 can comprise one or more optional additional features corresponding to one or more aspects mentioned in connection with the proposed concept or with one or more of the embodiments described above (for example FIGS. 1-7) or below.

There are embodiments relating to a self-adjusting graphene membrane.

According to one aspect, loading of a free-standing graphene membrane can be adjusted via mechanical stretching. This stretching can result from the different strength of adhesion of the graphene membrane on different (hydrophilic versus hydrophobic) substrate surfaces, and this can lead to ingress of the graphene membrane into the via holes (for example into the cut-out of the supportive substrate).

According to one aspect, the membrane voltage can be adjusted when using a free-standing graphene for MEMS.

According to one aspect, existing graphene membrane components can be replaced by the graphene membrane component of the invention without any direct influence on customers' systems or any modification of customers' systems.

The features disclosed in the above description, in the claims below, and in the figures attached can, either individually or else in any desired combination, in their various forms, be significant for, and implemented for, the realization of an embodiment.

Although some aspects have been described in connection with a device, it is self-evident that these aspects also represent a description of the corresponding process, and therefore that a block or a component of a device is also to be interpreted as a corresponding process step or as a feature of a process step. By analogy with the above, aspects described in connection with, or as, a process step also represent a description of a corresponding block or detail or feature of a corresponding device.

Embodiments of the present invention can generally be implemented as program, firmware, computer program or computer program product with a program code, or as data, where the program code or the data is/are effective for purposes of carrying out one of the processes when the program runs on a processor or a programmable hardware component. The program code or the data can also by way of example be stored on a machine-readable medium or data storage medium. The program code or the data can inter alia take the form of source code, machine code or byte code, or else other intermediate code. The data medium can be a digital storage medium, a magnetic storage medium, for example a diskette, a magnetic tape, or a hard disk, or an optically readable digital storage medium. A programmable hardware component can be a processor, a computer processor, (CPU=Central Processing Unit), a graphics processor (GPU=Graphics Processing Unit), a computer, a computer system, an application-specific integrated circuit (ASIC=Application-Specific Integrated Circuit), an integrated circuit (IC=Integrated Circuit), a one-chip system (SOC=System on Chip), a programmable logic element or a field-programmable gate array with a microprocessor (FPGA=Field Programmable Gate Array).

The description and drawings represent only the principles of the disclosure. It is therefore self-evident that the person skilled in the art can derive various arrangements which, although they are not expressly described or represented here, embody the principles of the disclosure and are comprised within the essence and scope of protection thereof. All of the examples presented here are moreover intended in principle to serve merely for pedagogical purposes, in order to assist the reader in the understanding of the principles of the disclosure and of the concepts contributed by the inventor(s) for the purpose of further development of the technology, and are to be interpreted as serving without restriction to these particular examples and parameters presented. All statements herein concerning principles, aspects and examples of the disclosure, and also particular examples of the same, are moreover intended to encompass equivalents thereof.

A block diagram can by way of example present a conceptual view of an example of a circuit, embodying the principles of the disclosure. Similarly, it is self-evident that all flowcharts, flow diagrams, state transition diagrams, pseudo codes and the like represent various procedures that are in essence represented in a computer-readable medium and are therefore executed by a computer or processor, irrespective of whether this computer or processor is expressly represented. The processes disclosed in the description or in the claims can be carried out by means of a device having means for conducting each of the respective steps of those processes.

It is moreover self-evident that the disclosure of a multiplicity of actions or functions disclosed in the description or in the claims should not be interpreted as implying the particular sequence stated. The disclosure of multiple actions or functions does not therefore restrict these to a particular sequence unless interchange of these actions or functions is impossible for technical reasons. A single action can moreover in some examples include a plurality of subsidiary actions or be divided into the same. These subsidiary actions can be included and form part of the disclosure of the said individual action, unless they are expressly excluded.

The claims below moreover are hereby incorporated into the detailed description, where each claim can per se represent a separate example. If each claim can per se represent a separate example, it must be observed that—although a dependent claim within the claims can refer to a particular combination with one or more other claims—other examples can also include a combination of the dependent claim with the subject matter of any other dependent or independent claim. These combinations are proposed here unless it is not stated that a particular combination is not intended. Features of any claim are moreover also intended to be included for every other independent claim, even if the said claim has not been made directly dependent on the independent claim.

What is claimed is:

1. A method of forming a graphene membrane component, the method comprising:
    arranging a graphene membrane in a relaxed condition of the graphene membrane on a surface of a supportive substrate, wherein the supportive substrate comprises an adhesive layer and a bulk region, the graphene membrane extends across a cut-out with an opening at the surface of the supportive substrate, and the graphene membrane is arranged so that a first portion of the graphene membrane is arranged on the surface of the supportive substrate and a second portion of the graphene membrane is arranged over the opening of the cut-out, and an energy of adhesion between the adhesive layer and the graphene membrane is greater than an energy of adhesion between the bulk region and the graphene membrane; and
    tensioning the second portion of the graphene membrane to convert the second portion of the graphene membrane to a tensioned condition, wherein the second portion of the graphene membrane is permanently in the tensioned condition in an operating temperature range of the graphene membrane component, the tensioning is achieved via inherent adhesion through attraction of a third portion of the graphene membrane to a portion of a wall of the cut-out, and the portion of the wall of the cut-out is formed by the adhesive layer.

2. The method according to claim 1, wherein the operating temperature range extends at least from 10° C. to 30° C.

3. The method according to claim 1, wherein a dimension of the second portion of the graphene membrane in the relaxed condition is less than 99% of a dimension of the second portion of the graphene membrane in the tensioned condition.

4. The method according to claim 1, wherein the graphene membrane has a third portion that lies between the first portion of the graphene membrane and the second portion of the graphene membrane, and the tensioning of the second portion of the graphene membrane is achieved via inherent adhesion through attraction of the third portion of the graphene membrane on at least one portion of a wall of the cut-out.

5. The method according to claim 4, wherein the supportive substrate comprises an adhesive layer that forms at least one portion of the surface of the supportive substrate on which the first portion of the graphene membrane is arranged, and forms a portion of the wall on which the third portion of the graphene membrane adheres, wherein the energy of adhesion between the graphene membrane and the adhesive layer is greater than 250 mJ per m$^2$.

6. The method according to claim 1, wherein arranging the graphene membrane in the relaxed condition of the graphene membrane on the surface of the supportive substrate comprises placing of the graphene membrane on a surface of a liquid and bringing the supportive substrate into contact with the graphene membrane placed on the surface of the liquid.

7. The method according to claim 6, wherein bringing the supportive substrate into contact with the graphene membrane comprises changing a level of the surface of the liquid.

8. The method according to claim 7, bringing the supportive substrate into contact with the graphene membrane comprises moving the supportive substrate in a direction of the surface of the liquid.

9. The method according to claim 7, further comprising:
    arranging the graphene membrane on a supportive membrane before arranging the graphene membrane on the surface of the supportive substrate; and
    removing the supportive membrane after the arranging the graphene membrane on the surface of the supportive substrate or after the tensioning the second portion of the graphene membrane.

10. The method according to claim 1, wherein arranging the graphene membrane in the relaxed condition of the graphene membrane on the surface of the supportive substrate comprises arranging of the graphene membrane on a surface of a pressure-applying device and pressing the pressure-applying device onto the surface of the supportive substrate.

11. The method according to claim 10, wherein the energy of adhesion between the surface of the pressure-applying device and the graphene membrane is less than 90% of the energy of adhesion between the first portion of the graphene membrane and the surface of the supportive substrate.

12. The method according to claim 10, where the pressure-applying device comprises a thermal release element, and arranging the graphene membrane in the relaxed condition of the graphene membrane on the surface of the supportive substrate further comprises heating the thermal release element in order to release the graphene membrane from the surface of the pressure-applying device.

13. The method according to claim 10, wherein arranging the graphene membrane in the relaxed condition of the graphene membrane on the surface of the supportive substrate is carried out at a relative humidity above 35%.

14. A method for forming a graphene membrane component, the method comprising:
    arranging a graphene membrane in a relaxed condition of the graphene membrane on a surface of a supportive substrate, wherein the graphene membrane extends across a cut-out with an opening at the surface of the supportive substrate, and a first portion of the graphene membrane is arranged on the surface of the supportive substrate and a second portion of the graphene membrane is arranged over the opening of the cut-out; and tensioning the second portion of the graphene membrane to convert the second portion of the graphene membrane to a tensioned condition, wherein the second portion of the graphene membrane is permanently in the tensioned condition in an operating temperature range of the graphene membrane component, wherein the graphene membrane and the supportive substrate have different coefficients of thermal expansion, arranging the graphene membrane in the relaxed condition of the graphene membrane on the surface of the supportive substrate is performed at a first temperature, and the tensioning of the second portion of the graphene membrane comprises heating or cooling the supportive substrate and the graphene membrane to a second temperature.

* * * * *